United States Patent [19]

Sato et al.

[11] Patent Number: 5,229,229
[45] Date of Patent: Jul. 20, 1993

[54] PELLICLE HAVING REFLECTION-PREVENTING FUNCTION

[75] Inventors: Shinji Sato; Kenichi Sekimoto, both of Machida; Katsuya Shibata, Higashikurume; Toru Seita, Atsugi, all of Japan

[73] Assignee: Tosoh Corporation, Yamaguchi, Japan

[21] Appl. No.: 689,340

[22] Filed: Apr. 23, 1991

[30] Foreign Application Priority Data

Apr. 27, 1990 [JP] Japan ................... 2-110139
Apr. 27, 1990 [JP] Japan ................... 2-110140
Apr. 27, 1990 [JP] Japan ................... 2-110141

[51] Int. Cl.$^5$ .................................................. G03F 9/00
[52] U.S. Cl. .................................... 430/5; 428/421; 428/422; 428/522; 428/524
[58] Field of Search ................ 430/5; 428/421, 422, 428/522, 524

[56] References Cited

U.S. PATENT DOCUMENTS

| | | | |
|---|---|---|---|
| 4,476,172 | 10/1984 | Ward | 428/38 |
| 4,690,869 | 9/1987 | Ohmori et al. | 428/421 |
| 4,966,813 | 10/1990 | Agou et al. | 428/421 |
| 4,970,099 | 11/1990 | Adams et al. | 428/76 |
| 5,008,156 | 4/1991 | Hong | 428/506 |
| 5,061,024 | 10/1991 | Keys | 359/350 |
| 5,168,001 | 12/1992 | Legare et al. | 428/194 |

*Primary Examiner*—Marion E. McCamish
*Assistant Examiner*—Rosemary Ashton
*Attorney, Agent, or Firm*—Nixon & Vanderhye

[57] ABSTRACT

A pellicle having a reflection-preventing function comprised of a transparent polyvinyl acetal film and a reflection-preventing film formed on at least one surface of the polyvinyl acetal film. The reflection-preventing film is made of a copolymer of a perfluoroalkyl acrylate or methacrylate with a hydroxyalkyl acrylate or methacrylate having (i) a hydroxyalkyl group having 2-3 OH groups on the terminal or side chain and 3-5 carbon atoms, (ii) a hydroxyalkyl group having an OH group on the terminal or side chain and 2-4 carbon atoms, or (iii) a fluorine-containing hydroxyalkyl group having an OH group on the terminal or side chain and 4-12 carbon atoms.

7 Claims, No Drawings ated of a semiconductor.

PELLICLE HAVING REFLECTION-PREVENTING FUNCTION

BACKGROUND OF THE INVENTION (1) Field of the Invention

This invention relates to a pellicle having reflection-preventing function which is characterized as having an improved light transmission and which is used as a dust cover for a photomask or reticle at the light exposure lithography of a semiconductor.

(2) Description of the Related Art

A proposal has already been made and practiced in which a dust cover called "pellicle" is built in a photomask or reticle for the light exposure lithography of a semiconductor to prevent or minimize the loss at the light exposure lithography step by dusts and enhance the productivity. Nevertheless, to shorten the light exposure time for further enhancing the productivity, it becomes urgently required that the transmission of the light from an exposure source must be further increased. As the means for coping with this requirement, a method has been proposed in which a pellicle is combined with a reflection-preventing film (see Japanese Unexamined Patent Publications No. 60-237450, 61-53601, 61-209449, 1-191852, 1-191853 and 1-191854), and fluorine-containing resins having a low refractive index have been mainly used for the preparation of the reflectionpreventing film.

The conventional fluorine-containing resins for the reflection-preventing film has a low refractive index, but the transparency is not always satisfactory and a sufficient improvement of the light transmission is not attained. Moreover, the adhesion between the main film of the pellicle and the reflection-preventing film is not satifactory, and when the laminated pellicle film is peeled from a pellicle-formed substrate, there is a large risk of separation between the main film of the pellicle and the reflection-preventing film. Accordingly, a special contrivance must be made to the peeling method for peeling a pellicle having a laminate structure, resulting in disadvantageous reduction of the productivity. Furthermore, control of the quality is difficult.

As the means for overcoming these advantages, a method is desired for improving a poor adhesion of the fluorine-containing resin while utilizing most of merits of the fluorine-containing resin.

SUMMARY OF THE INVENTION

Under the above-mentioned background, a primary object of the present invention is to provide a pellicle having a reflection-preventing film, which has a good light transmission and a low refractive index, and in which the poor adhesion possessed by a fluorine-containing polymer is improved, reflection of light is effected without degradation of the transparency of a main film of the pellicle and a good productivity can be attained.

The present inventors have found that a poor adhesion of a fluorine-containing resin to a polyvinyl acetal film is due to the fact that the fluorine-containing resin does not posses active sites on which bonding is effected, that is, active sites capable of forming intermolecular hydrogen bonds, and therefore, active sites capable of crosslinking between films through hydrogen bonds must be introduced for improving the adhesion and wettability. As the result, the adhesion and wettability could be improved by using a fluorine-containing copolymer having hydroxyl groups.

More specifically, in accordance with the present invention, there is provided a pellicle having a reflection-preventing function, which comprises a transparent film of a polyvinyl acetal and a reflection-preventing film formed on at least one surface of the transparent film, which is comprised of a copolymer comprising (1) units derived from a perfluoroalkyl acrylate or methacrylate represented by the following formula (I):

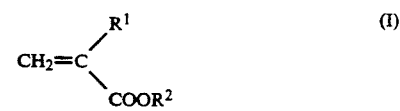

wherein $R^1$ represents hydrogen or a methyl group and $R^2$ represents a group expressed by $(CH_2)_m(CF_2)_n$ in which m is an integer of 1 or 2 and n is an integer of 3 to 14, and (2) units derived from a hydroxyalkyl acrylate or methacrylate represented by the following formula (II):

wherein $R^3$ represents hydrogen or a methyl group and $R^4$ represents (i) a hydroxyalkyl group having 2 to 3 hydroxyl groups on the terminal or side chain and 3 to 5 carbon atoms, (ii) a hydroxyalkyl group having a hydroxyl group on the terminal or side chain and 2 to 4 carbon atoms, or (iii) a fluorine-containing hydroxyalkyl group having a hydroxyl group on the terminal or side chain and 4 to 12 carbon atoms.

By using the above-mentioned copolymer as a reflection-preventing film-forming material, the adhesion and wettability of the reflection-preventing film are improved without the degradation of the transparency while maintaining a low refractive index, and a uniform laminate film can be formed by spin coating.

DESCRIPTION OF THE PREFERRED EMBODIMENTS

The polyvinyl acetal used in the present invention is preferably represented by the following formula (III):

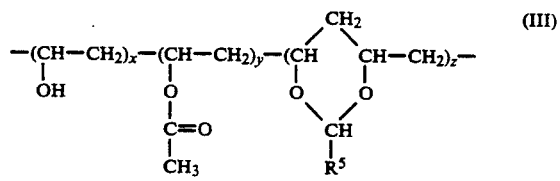

wherein $R^5$ represents a linear or branched alkyl group having 1 to 3 carbon atoms. The weight average molecular weight of the polyvinyl acetal is preferably 10,000 to 200,000. A pellicle made from a polyvinyl acetal having an average molecular weight lower than 10,000 has a poor strength. If the average molecular weight of the polyvinyl acetal exceeds 200,000, the viscosity of a solution of the polymer is too high and the formation of a film becomes difficult. The content of the vinyl acetate component, expressed by $y/(x+y+z)$ in the formula (III), is preferably not larger than 10% by mole, more preferably not larger than 5% by mole. If the content of the vinyl acetate component exceeds this range the transparency of the film in the ultraviolet ray region is decreased and the durability to long-time exposure to ultraviolet rays becomes poor. The degree of acetalization, expressed by $z/(x+y+z)$ in the formula (III), is at least 60% by mole. A film composed of a polyvinyl acetal having a degree of acetalization lower than this level is disadvantageous in that irreversible elongation or fogging is caused because of a high water content.

The resin used for the preparation of the reflection-preventing film in the present invention is comprised of a copolymer of a perfluoroacryl aclylate or methacrylate of the formula (I) with a hydroxyalkyl acrylate or methacrylate having an alkyl group having at least one hydroxyl group on the terminal or side chain or a fluorine-containing hydroxyalkyl acrylate or methacrylate having a hydroxyl group on the terminal or side chain.

To utilize most of merits of the fluorine-containing resin, such as a low refractive index and a low adhesion, an appropriate fluorine-containing monomer must be selected as the main perfluoroalkyl acrylate or methacrylate and a perfluoroalkyl acrylate or methacrylate having a fluorine content of at least 60% by weight should preferably used. If the content of fluorine in the perfluoroalkyl acrylate or methacrylate is lower than 60%, it becomes difficult to maintain a low refractive index, and the resin per se becomes soft and, when a reflection-preventing film is made from this resin, troubles such as wrinkling and sagging often occur. As the perfluoroalkyl acrylate or methacrylate satisfying this requirement, there can be mentioned a monomer of the formula (I) wherein the fluorine-containing group represented by $R^2$ is expressed by $(CH_2)_m(CF_2)_n$ where m is an integer of 1 or 2 and n is an integer of from 3 to 14, preferably from 6 to 12. As specific examples of $R^2$, there can be mentioned —$CH_2(CF_2)_6F$, —$CH_2(CF_2)_7F$, —$CH_2(CF_2)_8F$, —$CH_2(CF_2)_9F$, —$CH_2(CF_2)_{10}F$, —$CH_2(CF_2)_{11}F$, —$CH_2(CF_2)_{12}F$, —$CH_2CH_2(CF_2)_7F$, —$CH_2CH_2(CF_2)_8F$, —$CH_2CH_2(CF_2)_9F$, —$CH_2CH_2(CF_2)_{10}F$, —$CH_2CH_2(CF_2)_{11}F$ and —$CH_2CH_2(CF_2)_{12}F$.

The hydroxyalkyl acrylate or methacrylate to be copolymerized with the above-mentioned perfluoroalkyl acrylate or methacrylate is selected from those which are represented by the formula (II) and which are classified into the three types: the first type which has a hydroxyalkyl group having 2 to 3 hydroxyl groups on the terminal or side chain and 3 to 5 carbon atoms as $R^4$ in the formula (II); the second type which has a hydroxyalkyl group having a hydroxyl group on the terminal or side chain and 4 to 12 carbon atoms as $R^4$ in the formula (II); and the third type which has a fluorine-containing hydroxyalkyl group having a hydroxyl group on the terminal or side chain and 4 to 12 carbon atoms as $R^4$ in the formula (II).

To utilize the effect of the hydroxyl groups most efficiently, the first type hydroxyalkyl acrylate or methacrylate has 2 or 3 hydroxyl groups and a relatively small number of (i.e., from 3 to 5) carbon atoms in the hydroxyalkyl group $R^4$. As specific examples of $R^4$, there can be mentioned glycerol monoacrylate, glycerol monomethacrylate, pentaerythritol monoacrylate, pentaerythritol monomethacrylate, trimethylolethane monoacrylate and trimethylolethane monomethacrylate.

Similarly to utilize the effect of the hydroxyl group most efficiently, the second type hydroxyalkyl acrylate or methacrylate has a small number of (i.e., 2 to 4) carbon atoms in the hydroxyalkyl group $R^4$. As specific examples of $R^4$, there can be mentioned

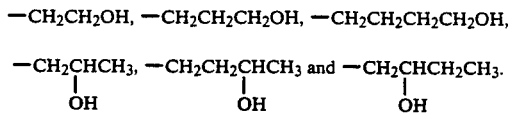

To utilize the effect of the hydroxyl group most efficiently, the third type hydroxyalkyl acrylate or methacrylate has a hydroxyl group located at the terminal of the hydroxyalkyl group $R^4$. As specific examples of $R^4$, there can be mentioned —$CH_2CF_2CF_2CH_2OH$, —$CH_2CH_2CF_2CF_2CH_2OH$, —$CH_2CH_2CF_2CF_2CH_2CH_2OH$, —$CH_2CF_2CF_2CF_2CH_2OH$, —$CH_2CH_2CF_2CF_2CF_2CH_2OH$, —$CH_2CH_2CF_2CF_2CF_2CH_2CH_2OH$, —$CH_2CF_2CF_2CF_2CF_2CH_2OH$, —$CH_2CH_2CF_2CF_2CF_2CF_2CH_2OH$ and —$CH_2CH_2CF_2CF_2CF_2CF_2CH_2CH_2OH$.

The ratio of the hydroxyalkyl acrylate or methacrylate of the formula (II) to the perfluoroalkyl acrylate or methacrylate of the formula (I) should be such that the low refractive index of the perfluoroalkyl acrylate or methacrylate of the formula (I) as the main component is increased only to a negligible extent. The suitable ratio varies depending upon the particular hydroxyalkyl acrylate or methacrylate of the formula (II). The amount of the first type hydroxyalkyl acrylate or methacrylate is preferably 2 to 30% by mole, more preferably 2 to 20% by mole, the amount of the second type hydroxyalkyl acrylate or methacrylate is preferably 5 to 30% by mole, more preferably 10 to 20% by mole, and the amount of the third type hydroxyalkyl acrylate or methacrylate is preferably 5 to 50% by mole, more preferably 10 to 20% by mole, based on the total of the hydroxyalkyl acrylate or methacrylate and the perfluoroalkyl acrylate or methacrylate.

If the amount of the hydroxyalkyl acrylate or methacrylate is smaller than the above-mentioned range, the intended effect of the hydroxyl group is not attained. If the amount of the hydroxyalkyl acrylate or methacrylate is larger than the above-mentioned range, not only increase of the refractive index but also opacification or gelation readily occur. By making a reflection-preventing film from the copolymer from the monomer mixture having the above-mentioned composition, without degradation of advantages of the fluorine-containing resin, such as a low refractive index and a low stickiness, the film-to-film adhesion can be enhanced by strong hydrogen bond crosslinking between the resin films, brought about by the hydroxyl groups of the copolymer, and the reflection-preventing film has an excellent light transmission with a high antistatic property.

The above-mentioned copolymer can be prepared by the conventionally adopted solution or bulk polymerization process. A radical polymerization initiator not causing opacification or discoloration of the copolymer and having no bad influences on the light transmission of the copolymer can be employed in the copolymerization. The polymerization initiator includes, for example, azobis compounds such as azobisisobutyronitrile, azobis-2,4-dimethylvareronitrile and azobiscyclohexane carbonitrile, and peroxide compounds such as benzoyl peroxide and di-tert.-butyl peroxide.

The fluorine-containing copolymer resin is overcoated on one or both of the surfaces of the polyvinyl acetal film to form a reflection-preventing film. In this case, the reflection-preventing film should be formed so that the requirement represented by the following formula is satisfied:

$$d = \frac{(2p + 1)}{q} \cdot \frac{\lambda}{4} \quad \text{(IV)}$$

wherein d represents the thickness of the reflection-preventing film, λ represents the wavelength of the intended light, p is an integer including zero and q represents the refractive index of the copolymer resin. Optimum conditions for satisfying this requirement can be determined in advance by checking the concentration and viscosity of the resin solution and the relation between the rotation number and film thickness in the case of spin coating.

The pellicle having a reflection-preventing film, of the present invention, is prepared, for example, according to the following process.

More specifically, a solution of the above mentioned fluorine-containing copolymer resin is spin-coated on a substrate such as a smooth glass sheet or silicon wafer to form a uniform film. The film thickness is adjusted so that the requirement of the above-mentioned formula (IV) is satisfied relatively to the wavelength of the intended light. The solvent used for dissolving the fluorine-containing copolymer resin must be such that the polyvinyl acetal resin is insoluble therein and the solvent is not repelled by the polyvinyl acetal resin. As specific examples of the solvent satisfying this requirement, there can be mentioned aromatic fluorine compounds such as metaxylene hexafluoride, perfluoroalkyl group-containing alcohols, hexafluoropropylene oligomers and fluorine-containing ethers. Among these solvents, metaxylene hexafluoride is especially preferably used to give a highly homogeneous film by spin coating.

Then the coating film is thoroughly dried by irradiation with infrared rays or other radiation, and a solution of the polyvinyl acetal resin is applied onto the dry film and spin coating is similarly carried out to effect lamination. As the solvent for dissolving the polyvinyl acetal resin, ketone solvents such as methyl ethyl ketone, methyl isobutyl ketone and cyclohexane are preferably used.

The laminate film is thoroughly dried by irradiation with infrared rays or other radiation, and a solution of the fluorine-containing copolymer resin is again applied onto the laminate film and spin coating is carried out to form a third film. The thickness of the third film should be adjusted so that requirement of the formula (IV) is satisfied relatively to the wavelength of the intended light, as in the case of the first film. The thus-formed laminate film having a two layer or three-layer structure is peeled from the substrate so as to use the laminate film as a pellicle. The laminate film can be peeled from the substrate very easily by placing an adhesive-coated frame on the two-layer or three-layer laminate film formed on the substrate so that the outer layer, that is, the fluorine-containing copolymer resin film exposed to the outer atmosphere, is placed in contact with the frame, press-bonding the assembly and lifting up the frame from one end thereof. Alternatively, after the laminate film is bonded to the frame, the assembly is immersed in water and the laminate film can be naturally separated from the substrate. Since a high bonding force is maintained between the layers in the two-layer or three-layer laminate film by the hydroxyl groups of the fluorine-containing copolymer, interlaminar separation does not occur when the laminate film is peeled from the substrate, and thus, a homogeneous pellicle having a reflection-preventing function can be prepared.

As described hereinbefore, according to the present invention, the defects of the conventional fluorine-containing resin, such as poor adhesion and poor wettability, can be overcome while maintaining advantageous merits of the fluorine-containing resin, such as low refractive index and low stickiness, by employing the specified fluorine-containing copolymer of a perfluoroalkyl acrylate or methacrylate with a hydroxyalkyl acrylate or methacrylate, and simultaneously, the light transmission can be improved. The variation of the light transmission to g rays (436 nm) and i rays (365 nm) due to interference with the reflected light can be reduced, and the light exposure time can be shortened at the light treatment of a semiconductor and the productivity can be increased.

In the pellicle of the present invention, the adhesion of the fluorine-containing copolymer resin to the transparent polyvinyl acetal film is high and the interlaminar separation of the laminate film can be effectively prevented and the productivity of the pellicle can be increased.

The present invention will now be described in detail with reference to the following examples that by no means limit the scope of the invention.

EXAMPLE 1

Synthesis of Fluorine-Containing Copolymer

In 13.88 g of metaxylene hexafluoride were dissolved 5.75 g (10.8 millimoles) of 2-(perfluorooctyl)ethyl methacrylate, 0.19 g (1.2 millimoles) of glycerol monomethacrylate and 5.9 mg (0.036 millimole) of azobisisobutyronitrile, and the solution was deaerated and the atmosphere was replaced by argon. Then the solution was stirred at 70° C. for 4 hours.

The reaction mixture was diluted with 15 g of metaxylene hexafluoride, and 500 ml of methanol was dropped into the solution to precipitate the formed polymer. The polymer was purified by dissolution in metaxylene hexafluoride and precipitation by methanol and was then vacuum-dried for 12 hours to obtain 5.49 g of a polymer. The refractive index of the polymer was 1.3722 at 22° C.

Preparation And Evaluation of Pellicle

A polyvinyl propional having an average molecular weight of 88,000, a vinyl acetate content of 0.2% by mole and an acetalization degree of 80% by mole was dissolved at a concentration of 9.5% by weight in cyclohexane. Separately, the above-mentioned 2-(perfluorooctyl)ethyl methacrylate/glycerol monomethacrylate copolymer was dissolved at a concentration of 5.0% by weight in metaxylene hexafluoride.

The fluorine-containing copolymer resin solution was spin-coated on a silicon wafer having a diameter of 6 inches as the substrate to form a film, and the film was vacuum-dried. The polyvinyl propional solution was spin-coated on the formed film to form a laminate film, and the laminate film was vacuum-dried. Then the fluorine-containing copolymer resin solution was again spin-coated on the laminate film, and the formed laminate film was vacuum-dried.

An aluminum frame having an outer side of 91 mm, a thickness of 2.5 mm and a height of 5.5 mm was bonded to the obtained three-layer pellicle by using an adhesive, and the laminate film bonded to the supporting frame was peeled from the substrate to obtain a three-layer pellicle having reflection-preventing layers on both surfaces.

The light transmission of the pellicle was 98.0% on the average to rays of 350 to 450 nm, and the minimum light transmission was 95.5%.

In contrast, in the film composed solely of the polyvinyl propional, which had no reflection-preventing film, the average light transmission was 93% and the minimum light transmission was 86.5%.

COMPARATIVE EXAMPLE 1

Synthesis of Fluorine-Containing Copolymer

In the same manner as described in Example 1, 5.28 g of a fluorine-containing copolymer was synthesized from 5.60 g (10.8 millimoles) of 2-(perfluorooctyl)ethyl acrylate, 0.14 g (1.2 millimoles) of propyl acrylate and 5.9 mg (0.036 millimole) of azobisisobutyronitrile. The refractive index of the obtained copolymer was 1.3723 at 22° C.

Preparation And Evaluation of Pellicle

In the same manner as described in Example 1, a three layer pellicle was formed on a silicon wafer having a diameter of 6 inches from a metaxylene hexafluoride solution containing 5.0% by weight of the above-mentioned 2-(perfluorooctyl)ethyl acrylate/propyl acrylate copolymer and a cyclohexanone solution containing 9.5% by weight of the polyvinyl propional used in Example 1.

An aluminum frame was bonded to the laminate film, and the laminate film was peeled from the substrate. At this peeling step, separation occurred between the fluorine-containing copolymer film and the polyvinyl propional film, and thus, a pellicle having a three-layer structure could not be obtained.

EXAMPLE 2

Synthesis of Fluorine-Containing Copolymer

In 13.44 g of metaxylene hexafluorine were dissolved 5.60 g (10.8 millimoles) of 2-(perfluorooctyl)ethyl acrylate, 0.16 g (1.2 millimoles) of 2-hydroxypropyl acrylate and 5.9 mg (0.036 milimole) of azobisisobutyronitrile, and the solution was deaerated and the atmosphere was replaced by argon. Then the solution was stirred at 70° C. for 4 hours.

The reaction mixture was diluted with 15 g of metaxylene hexafluoride, and 500 ml of methanol was dropped into the solution to precipitate the formed polymer. The polymer was purified by dissolution in metaxylene hexafluoride and precipitation by methanol and was then vacuum-dried for 12 hours to obtain 5.27 g of a polymer. The refractive index of the polymer was 1.3729 at 22° C.

Preparation And Evaluation of Pellicle

A polyvinyl propional having an average molecular weight of 88,000, a vinyl acetate content of 0.2% by mole and an acetalization degree of 80% by mole was dissolved at a concentration of 9.5% by weight in cyclohexane. Separately, the above-mentioned 2-(perfluorooctyl)ethyl acrylate/2-hydroxypropyl acrylate copolymer was dissolved at a concentration of 5.0% by weight in metaxylene hexafluoride.

The fluorine-containing copolymer resin solution was spin-coated on a silicon wafer having a diameter of 6 inches as the substrate to form a film, and the film was vacuum-dried. The polyvinyl propional solution was spin-coated on the formed film to form a laminate film, and the laminate film was vacuum-dried. Then the fluorine-containing copolymer resin solution was again spin-coated on the laminate film, and the formed laminate was vacuum-dried.

An aluminum frame having an outer side of 91 mm, a thickness of 2.5 mm and a height of 5.5 mm was bonded to the obtained three layer pellicle by using an adhesive, and the laminate film bonded to the supporting frame was peeled from the substrate to obtain a three-layer pellicle having reflection-preventing layers on both surfaces.

The light transmission of the pellicle was 98.5% on the average to rays of 350 to 450 nm, and the minimum light transmission was 95.5%.

EXAMPLE 3

Synthesis of Fluorine-Containing Copolymer

In the same manner as described in Example 2, 4.91 g of a fluorine-containing copolymer was synthesized from 5.60 g (10.8 millimoles) of 2-(perfluorooctyl)ethyl acrylate, 0.14 g (1.2 millimoles) of 2-hydroxyethyl acrylate and 5.9 mg (0.036 millimole) of azobisisobutyronitrile. The refractive index of the obtained copolymer was 1.3706 at 22° C.

Preparation And Evaluation of Pellicle

In the same manner as described in Example 2, a three-layer pellicle having reflection-preventing layers on both surfaces was formed on a silicon wafer having a diameter of 6 inches from a metaxylene hexafluoride solution containing 5.0% by weight of the above-mentioned 2-(perfluorooctyl)ethyl acrylate/2-hydroxyethyl acrylate copolymer and a cyclohexanone solution containing 9.5% by weight of the polyvinyl propional used in Example 2.

The light transmission of the obtained pellicle to rays of 350 to 450 nm was 98.6% on the average, and the minimum light transmission was 96.7%.

EXAMPLE 4

Synthesis of Fluorine-Containing Copolymer

In 100 ml of benzene were dissolved 18 g of acrylic acid and 76 g of 3-(perfluoro-n-octyl)propylene oxide, and 0.05 g of hydroquinone and 0.25 g of pyridine were added to the solution and the mixture was refluxed for 50 hours.

Benzene was distilled off by distillation under a reduced pressure, and 59.2 g of 2-hydroxy-3-(perfluoro-n-octyl)propyl acrylate was obtained by distillation under a reduced pressure.

Then 0.84 g of the thus-obtained 2-hydroxy-3-(perfluoro-n-octyl)propyl acrylate, 4.96 g of 2-(perfluorooctyl)ethyl acrylate and 5.9 mg of azobisisobutyronitrile were dissoved in 13.44 g of metaxylene hexafluoride, and the solution was deaerated and the atmosphere was replaced by argon. The solution was stirred at 70° C., for 4 hours.

The reaction mixture was diluted with 15 g of metaxylene hexafluoride, and 500 ml of methanol was dropped into the solution to precipitate the formed polymer. The polymer was purified by dissolution in metaxylene hexafluoride and precipitation by methanol and was then vacuum-dried to obtain 4.85 g of a polymer. The refractive index of the polymer was 1.3582 at 22° C.

Preparation And Evaluation of Pellicle

A polyvinyl propional having an average molecular weight of 88,000, a vinyl acetate content of 0.2% by mole and an acetalization degree of 80% by mole was dissolved at a concentration of 9.5% by weight in cyclohexanone. Separately, the above-mentioned 2-(perflurooctyl)ethyl acrylate/2-hydroxy-3-(perfluorooctyl)propyl acrylate copolymer was dissolved at a concentration of 5.0% by weight in metaxylene hexafluoride.

The fluorine-containing copolymer resin solution was spin-coated on a silicon wafer having a diameter of 6 inches as the substrate to form a film, and the film was vacuum-dried. The polyvinyl propional solution was spin-coated on the formed film to form a laminate film, and the laminate film was vacuum-dried. Then the fluorine-containing copolymer resin solution was again spin-coated on the laminate film, and the formed laminate film was vacuum-dried.

An aluminum frame having an outer side of 91 mm, a thickness of 2.5 mm and a height of 5.5 mm was bonded to the obtained three-layer pellicle by using an adhesive, and the laminate film bonded to the supporting frame was peeled from the substrate to obtain a three-layer pellicle having reflection-preventing layers on both surfaces.

The light transmission of the pellicle was 97.5% on the average to rays of 350 to 450 nm, and the minimum light transmission was 95.5%.

EXAMPLE 5

Synthesis of Fluorine-Containing Copolymer

In 100 ml of benzene were dissolved 65.6 g of 2,2,3,3,4,4,5,5-octafluoro-1,6-hexanediol and 11.9 g of pyridine, and 10.4 g of methacrylic chloride was dropped into the solution and the mixture was stirred at 25° C. for 3 hours.

The reaction mixture was washed with deionized water three times and the solvent was removed from the organic layer by distillation under a reduced pressure, to obtain 28.9 g of 2,2,3,3,4,4,5,5-octafluoro-6-hydroxyhexyl methacrylate.

In the same manner as described in Example 4, 5.54 g of a fluorine-containing copolymer was prepared from 0.40 g of the thus-prepared 2,2,3,3,4,4,5,5-octafluoro-6-hydroxyhexyl methacrylate and 5.60 g of 2-(perfluorooctyl)ethyl acrylate. The refractive index of the fluorine-containing copolymer was 1.3635 at 22° C.

Preparation And Evaluation of Pellicle

In the same manner as described in Example 4, a three-layer pellicle having reflection-preventing layers on both surfaces was formed on a silicon wafer having a diameter of 6 inches from a metaxylene hexafluoride solution containing 5.0% by weight of the above-mentioned 2-(perfluorooctyl)ethyl acrylate/2,2,3,3,4,4,5,5-octafluoro-6-hydroxyhexyl methacrylate copolymer and a cyclohexanone solution containing 9.5% by weight of the polyvinyl propional used in Example 4.

The light transmission of the thus-prepared pellicle to rays of 350 to 450 nm was 98% on the average and the minimum light transmission was 95.5%.

What is claimed is:

1. A pellicle having a reflection-preventing function, which comprises a transparent film of a polyvinyl acetal and a reflection-preventing film formed on at least one surface of the transparent film, said reflection-preventing film being comprised of a copolymer comprising (1) units derived from a perfluoroalkyl acrylate or methacrylate represented by the following formula(I):

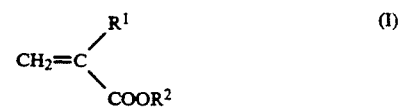

wherein $R^1$ represents hydrogen or a methyl group and $R^2$ represents a group expressed by $(CH_2)_m(CF_2)_n$ in which m is an integer of 1 or 2 and n is an integer of 3 to 14, and (2) units derived from a hydroxyalkyl acrylate or methacrylate represented by the following formula (II):

wherein $R^3$ represents hydrogen or a methyl group and $R^4$ represents (i) a hydroxyalkyl group having 2 to 3 hydroxyl groups on the terminal or side chain and 3 to 5 carbon atoms, (ii) a hydroxyalkyl group having a hydroxyl group on the terminal or side chain and 2 to 4 carbon atoms, or (iii) a fluorine-containing hydroxyalkyl group having a hydroxyl group on the terminal or side chain and 4 to 12 carbon atoms.

2. A pellicle according to claim 1, wherein the amount of the units derived from the hydroxyalkyl acrylate or methacrylate of the formula (II) in the copolymer is (i) 2 to 30% by mole when $R^4$ in the formula (II) is a hydroxyalkyl group having 2 to 3 hydroxyl groups and 3 to 5 carbon atoms, (ii) 5 to 30% by mole when $R^4$ in the formula (II) is a hydroxyalkyl group having a hydroxyl group and 2 to 4 carbon atoms, or (iii) 5 to 50% by mole when $R^4$ is a fluorine-containing hydroxyalkyl group having a hydroxyl group and 4 to 12 carbon atoms, said amount being based on the total of the units derived from the perfluoroalkyl acrylate or methacrylate of the formula (I) and the units derived from the hydroxyalkyl acrylate or methacrylate of the formula (II).

3. A pellicle according to claim 1, wherein the polyvinyl acetal is represented by the following formula (III):

$$-(CH-CH_2)_x-(CH-CH_2)_y-(CH\phantom{XX}CH-CH_2)_z-$$

(with substituents OH; O-C(=O)-CH_3; O-CH(R^5)-O forming ring with CH_2)

wherein $R^5$ represents a linear or branched alkyl group having 1 to 3 carbon atoms, and x, y and z are such that the content of the vinyl acetate component, expressed by $y/(x+y+z)$, is not larger than 10% by mole and the degree of acetalization, expressed by $z/(x+y+z)$, is at least 60% by mole.

4. A pellicle according to claim 1, wherein the polyvinyl acetal has an average molecular weight of 10,000 to 200,000.

5. A pellicle according to claim 1, wherein the perfluoroalkyl methacrylate or acrylate of the formula (I) contains at least 60% by weight of fluorine.

6. A pellicle according to claim 1, wherein n in the formula $(CH_2)_m(CF_2)_n$ is an integer of 6 to 12.

7. A pellicle according to claim 1, wherein the reflection-preventing film satisfies the requirement expressed by the following formula (IV):

$$d = \frac{(2p+1)}{q} \cdot \frac{\lambda}{4} \qquad (IV)$$

wherein d represents the thickness of the reflection preventing film, $\lambda$ represents the wavelength of the intended light, p is an integer including zero and q represents the refractive index of the copolymer.

* * * * *